United States Patent [19]

Pryst et al.

[11] Patent Number: 4,672,358
[45] Date of Patent: Jun. 9, 1987

[54] SURFACE-MOUNTED POWER RESISTORS

[75] Inventors: Theodore S. Pryst, Glenview; John G. Kirschner, Northbrook, both of Ill.

[73] Assignee: North American Philips Corp., New York, N.Y.

[21] Appl. No.: 864,777

[22] Filed: May 19, 1986

[51] Int. Cl.⁴ ........................ H01C 1/02; H01C 1/034
[52] U.S. Cl. .................................... 338/226; 338/275
[58] Field of Search .............................. 338/272–275, 338/226, 269; 361/400, 401, 404–406, 417–420; 29/610, 613

[56] References Cited

U.S. PATENT DOCUMENTS

| | | | |
|---|---|---|---|
| 2,640,132 | 5/1953 | Thom | 338/274 X |
| 3,919,682 | 11/1975 | Costa | 338/269 X |
| 4,333,069 | 6/1982 | Worth et al. | 338/275 X |
| 4,435,741 | 3/1984 | Shimizu et al. | 361/401 |

FOREIGN PATENT DOCUMENTS 2657690  3/1978  Fed. Rep. of Germany ...... 338/226

OTHER PUBLICATIONS

R. J. Klein Wassink and H. J. Vledder, *Philips Technical Review*, 40, 342-8 (1982).

Primary Examiner—C. L. Albritton
Attorney, Agent, or Firm—Eugene I. Snyder

[57] ABSTRACT

A surface-mount power resistor may be fabricated using a power resistor of conventional design as its core. A conventional resistor is reworked so as to flatten its leads from a point near their emergence from the generally tubular body of the resistor to the ends of the leads. The reworked resistor is then encapsulated from a point on the flattened portion of one lead to a corresponding point on the other lead, with the resulting mold being shaped as to have at least two opposing flat surfaces. The ribbon-shaped portions of the leads which exit from the molded body are then shaped as desired to afford the finished product. Similar surface-mount electrical components may be fabricated for any component with axial leads.

13 Claims, 6 Drawing Figures

SURFACE-MOUNTED POWER RESISTORS

BACKGROUND OF THE INVENTION

The reduction in size of electrical assemblies in the past 25 years has resulted from more-or-less distinct stages of technological advancement. The first stage was associated with the replacement of vacuum tubes by various solid state devices, such as transistors. Another stage accompanied fabrication of such devices on a single, discrete piece of material, as a chip or wafer. Later stages accompanied the manufacture of a complete assembly of such devices, along with inactive components as resistors and capacitors, on a single chip, resulting in an integrated circuit which first were merely large scale integration, (LSI), then very large scale integration (VSLI).

Accompanying the evolution of ever decreasing size of components and of integrated circuits was a concurrent development in packaging the assembly of such devices to achieve minimum finished product size. The printed circuit board has continued to represent an effective physicl medium for architectural construction of the completed assembly. With improved methods of etching and continued development of laminates the printed circuit board has evolved from a rather thick plate with widely spaced components on one side to a strong, thin laminate with densely packed components on both sides.

Although reduction in component and package size have been independent advances they clearly have been interdependent advances, in the context that the advantages of advances in one area are fully realized only with corresponding advances in the other area. In relatively recent years the technique of printed circuit board assembly has changed to increasingly emphasize surface-mount devices, i.e., miniature, largely leadless components which are directly soldered to the surface of a printed circuit board rather then requiring holes in a substrate through which a lead from a component is soldered. One advantage of surface-mounted devices is an increased board density through elimination of holes, and through mounting of components on both sides of a printed ciruit board. Another advantage is better performance, especially at high frequencies, resulting from the reduction in lead length. The process of surface mounting can be, and has been, extensively automated, leading to increased product reliability, greater production rate, and lowered assembly cost. The impetus for surface mounting has come from the desire for miniaturization, for improved quality and reliability, and from production economies.

Automation techniques for surface mounting devices on a printed circuit board utilize systems which pick off the devices from bulk, tapes, tubes or reels on which the devices are packaged, and precisely place the devices at their designated position on the printed circuit board, immobilize each of the devices to the printed circuit board via adhesive contact or solder paste, and finally solder the devices to make electrical connections on the board. This process in turn imposes some requirements on devices for optimum efficiency. One is that at least one surface, and preferably two opposing surfaces, be flat. The placement head of the automated system can more readily pick up the device from the tape or reel on which it is packaged if a flat surface is presented, since the pickup often is via suction. It is also desirable that the surface of the device contacting the board be flat so that after the device is placed on the board, but before the adhesive hardens, it will not move. Another requirement is that the surface-mount devices have flat leads, for if they have round leads there is minimal contact with bonding pads on the printed circuit board and subsequent soldering may lead to a relatively high proportion of poor electrical connections. This need to have an adequate solder area is often referred to by saying that the device needs to have a good footprint.

Many electrical components presently are packaged as surface-mount devices, including integrated circuits, chip capacitors and chip resistors, but the described limitations have imposed serious constraints on, e.g., the power range of surface-mounted resistors. To date the surface-mount resistors are generally in the 1/10 to ¼ watt range, and it has been stated that surface-mount versions of power resistors are not really practical. R. J. Klein Wassink and H. J. Vledder, *Philips Technical Rev.*, 40, 342-8(1982). In the context of this application a power resistor is one with a power rating of at least 1 watt. Reasons for the lack of an economically viable surface-mount version of power resistors include improper shape, excessive heat generation at the board surface, and flexing of soldered leads.

Power resistors, whether wire wound or metal film, traditionally are manufactured in cylindrical or tubular form, and in fact expensive retooling and redesigning would be necessary to manufacture them in another form, for example, one with two opposing flat surfaces. As a surface-mount device tubular power resistors would generate much heat at their point of contact with the printed circuit board, and since contact surface is minimal the local heat density would be intense. Cyclic heat generation also would cause stress flexing of the solder connection ultimately causing electrical failure at the solder joint or flexing along the lead which might result in its structural failure.

Prior attempts to address these problems led to power resistors with a rectangular metal cap soldered at each end to provide two opposing flat surfaces, and with round leads which have been flattened and bent. Although the problem of vacuum pickup is at least partially solved by such a device, as is the tendency of a tubular resistor to roll when placed on a printed circuit board, the problems of attending heat generation along a small contact surface and of flexure remain. In fact the difficulties arising from flexing are even more severe than if the lead is cylindrical, for the point of transition from a round to a flat lead is structurally quite weak, and the flex stress communicated is somewhat localized at just this transition point. Surface-mount power resistors of the aforedescribed design have notoriously high failure rates, entirely defeating the reliability of an assembly, normally one of the advantages of surface mounting.

Thus there are several problems which must be overcome in order to deliver to the marketplace a surface-mount power resistor. The invention described within is a surface-mount power resistor which has indeed cured all the deficiencies of prior art devices to afford an economically viable component. The solution to problems inherent in power resistors also is applicable to other devices, so that even though our emphasis has been, and will remain, on power resistors it is to be clearly understood that our solution is applicable to all axial lead compenents generally, including capacitors, diodes, and inductors.

SUMMARY OF THE INVENTION

The purpose of this invention is to provide surface-mount power resistors, i.e., resistors of at least 1 watt. Even more generally, the purpose is to provide surface-mount electrical devices generally.

DESCRIPTION OF THE INVENTION

Our solution to the problem of surface-mount power resistors is simple, elegant, and powerful, the same solution being generally applicable to surface-mount electrical components with axial leads. The solution, which leads to the invention claimed, has as its core a power resistor of conventional design with round, axial leads. Each lead is flatened into a ribbon from a point near its emergence from the resistor body to the terminus of the lead, so that each transition point, which is that point of demarcation on the electrical lead where its cross-section changes from circular to rectangular, is close to the resistor body. The resistor is then encased in a hardened, electrically insulating molding compound so that its leads are embedded and structurally supported by the molding compound from a point on the ribbon portion of one lead to a similar point on the other lead. As a result the transition points, which are structurally the weakest point of such a resistor configuration, are rigidly held in the mold. Additionally, the resulting molded body is so shaped as to have two opposing flat surfaces, preferably coparallel with the ribbon portion of the leads emerging from each end of the molded body. The flat ribbon portion of the leads emerge in an approximately coplanar relationship at their point of exit from the molded body, but since the intended use of the resistor is as a surface-mounted component the flattened leads are shaped outside of the molded body as described below.

An important characteristic of the surface-mount power resistor which is our invention is that the weakest structural point in the unit—the transition points—are not subjected to the flexing stress accompanying the repeated heating and cooling cycles which occur in the resistor's normal operation. Another advantage is that the substantially increased surface area of the molded body leads to effective heat dissipation and reduces surface temperature, i.e., the heat density on the surface of the final product is generally lower than that with a conventional resistor. Since surface-mount power resistors are intended to be mounted on or close to the printed ciruit board this reduces the heat transferred to the board, reducing the chance of damaging the board or heat-sensitive components in the vicinity. Another advantage accompanying efficient heat dissipation is that surface-mount power resistors of the disclosed design can safely operate at their rated power. Yet another advantage is that since the fabrication methods are well known no special tooling is necessary, and the methods are readily adapted to production of a wide variety of surface-mount components while using the most appropriate design of the conventional component.

Figure 1:
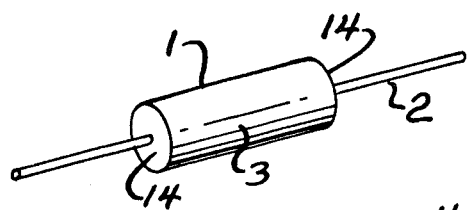
FIG. 1 is a perspective view of a conventional cylindrical resistor with round, axial leads.

Our invention is better understood with reference to the figures and the following description, which also will describe a process for its manufacture starting with a power resistor of conventional design. FIG. 1 is a view of the surface-mount power resistor of our invention showing many of its important features. At the core of the surface-mount power resistor is a power resistor of conventional design, 1. Construction of this resistor is not important; thus, the resistive element may be a wound wire, metal film, carbon film, cermet, metal oxide, or any other resistive material. The resistive element is electrically connected to round leads, 2, with the leads emerging at either end, 14, of the resistor body, 3. Typically the resistor body is tubularly shaped, although its shape is not material to the success of our invention.

The point of departure in producing our surface-mount power resistor is to flatten the round leads 2 from a point, 13, adjacent to its point of exit from the resistor body to the free end or terminus of the lead. The point 13 is referred to as the transition point, and is structurally and mechanically the weakest link in the device as formed at this stage. The flattened portion of each lead is then trimmed so as to regulate its width to afford a ribbon 4, of a well-defined, controlled width from the transition point to its free end. Each lead is flattened in the same plane, i.e., the ribbon portions of each lead are approximately copolanar. In the preferred embodiment of our invention the round and flat portions of the lead, 2 and 4, form a single piece, i.e., the round portion of the lead is mechanically flattened from the transition point to its terminus. However, an alternative is to have the round and flat portions arise from two different pieces which are mechanically and electrically joined, the junction becoming the transition point. For example, the round lead may be clipped at a point close to the resistor body and a second lead in the form of a flat ribbon joined thereto. Both embodiments are intended to be encompassed within our invention even though the first is much preferred.

The article at this stage of manufacture is then encapsulated and embedded in a molding compound from a point on the ribbon portion of one lead to the corresponding point on the other lead, thereby embedding the body of the resistor of conventional design, including the transition points, in a hard, rigid matrix which provides structural support for the transition points. The molding compound, often a filled epoxy or other thermosetting resin, is an electrical insulator but a heat conductor. Since the product is a power resistor substantial heat will be generated in the interior of the mold, and the molding compound needs to be able to maintain its structural integrity under conditions of use. Suitable molding compounds are well known to those practicing this art, but subject to the stated functional limitations the choice of compound is unconnected to the success of this invention. The length 20 of the ribbon portion of the lead which is encapsulated, as well as the length 21 of the rounded portion of the lead between the transition point 13 and an end 14 of the body of the resistor of conventional design is kept as short as is possible, since surface-mount devices become more desirble with decreasing size. On the other hand the length 20 must be sufficiently great as to achieve the purpose of the rigid matrix in providing structural support to the transition points.

Figure 5:
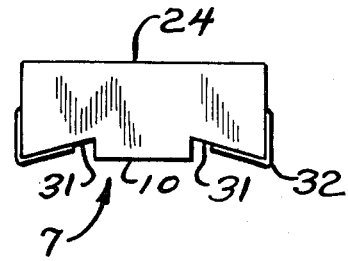
FIGS. 5 and 6 are side views of surface-mounted resistors with a J-bend design.
Figure 6:
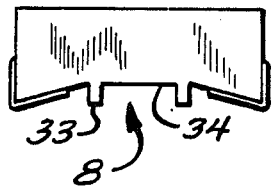

The body of the hardened mold, 24, is also shaped so that at least two opposing surfaces, 5 and 15, other than the ends, 6, are flat and approximately coparallel. More often the hardened mold is a rectangular block, or box-like in shape, with all surfaces flat and all opposing surfaces approximately coparallel, but it is important to recognize that in absolute terms it is necessary that only two opposing surfaces be flat for the success of this invention. In the context of this disclosure and its claim the term "flat" includes irregularly shaped surfaces of the mold whose outermost points are coplanar, and whose plane is approximately coparallel with the opposng flat surface. Thus, by way of illustration, "flat" is intended to encompass the irrregularly shaped surfaces 7 and 8 of some alternate designs of our invention as shown in FIGS. 5 and 6, respectively. For convenience the opposing surfaces 5 and 15 will be referred to as the upper and lower surface, respectively.

Figure 4:
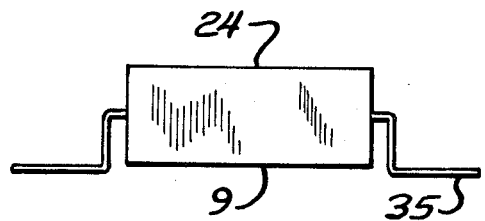
FIG. 4 is a side view of a surface-mounted resistor of a gullwing design.

The next stage in manufacture is to cut the leads to size and form them into the desired shape. The leads of conventional resistors are far longer than are needed for surface-mounted devices, and leads are cut to afford a length of ribbon suited for surface-mounting. The shape of the leads can be of many varieties, although the gullwing and J-bend are the most popular designs. In the gullwing design, as depicted in FIG. 4, the ribbon is bent downwardly at about a 90 degree angle at a point close to the body 24, and then bent again at about a 90 degree angle in the opposite direction at a point close to but generally extending somewhat beyond the lower surface 9 of the surface-mount device to form the footprint 35. In this configuration the space between the lower surface 9 and the printed circuit board is generally filled with an adhesive which maintains the position of the surface-mounted device on the board prior to soldering of the leads to connections on the board and/or the space under the footprint 35 is filled with solder paste.

FIG. 5 shows a surface-mount device with a J-bend. In this configuration the leads 4 are bent downwardly at about a 90 degree angle a a point close to the body 24. The lower surface 7 of the device is irregularly shaped, with a flat central portion 10, and two outer recesses 31 for receiving the leads. The leads are bent again in the same direction at an angle somewhat greater than 90 degrees so that the terminal portion of the leads fit into the recesses. Although the recesses are depicted as having their inner portions inclined toward the upper surface, i.e., the innermost parts of the recess are closer to the upper surface than are the outermost portions, it is not absolutely necessary this this be the case, and the recesses may have their upper part coparallel with the upper and lower surfaces. Note that the recesses are so dimensioned that after the leads are formed into the recesses the edge 32 of the leads and the central flat portion 10 are approximately coplanar. This imparts stability to the device when initially placed on the board. The feet support the device on the printed circuit board and are of sufficient width as to impart spatial stability to the resistor after it is place on the printed circuit board but before being in adhesive contact therewith.

Another possible design is shown in FIG. 6, which differs from the preceding one in that part of the central flat portion 10 has been cut away so as to give an irregularly shaped lower surface with outer recesses 31, two rectangular protrusions or pedestals (or feet), 33, which define a coplanar surface, and a central portion 34 which can act as a channel for cooling after the device is mounted to the printed circuit board and facilitates cleaning in some manufacturing processes.

It will be clear from the preceding description that the final shape of the surface-mount power resistor is susceptible of many variations in appearance to accommodate design or esthetic requirements without substantially altering its functional characteristics. All such shapes are, and are intended to be, subsumed under our invention, for it is the theme that is our invention, and the variations of that theme flow naturally therefrom.

Figure 2:
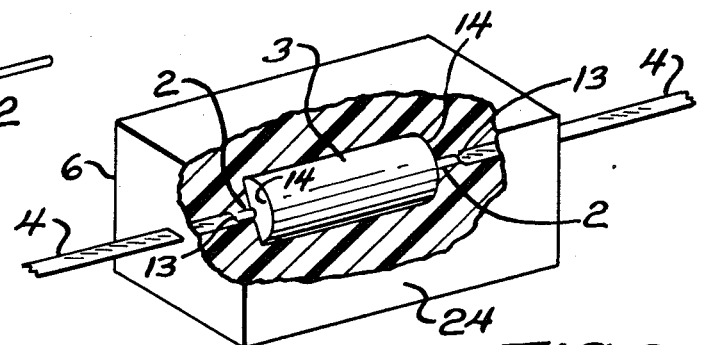
FIG. 2 is a broken away perspective view of a surface-mounted resistor of this invention showing the conventional resistor embedded in a hardened mold.
Figure 3:
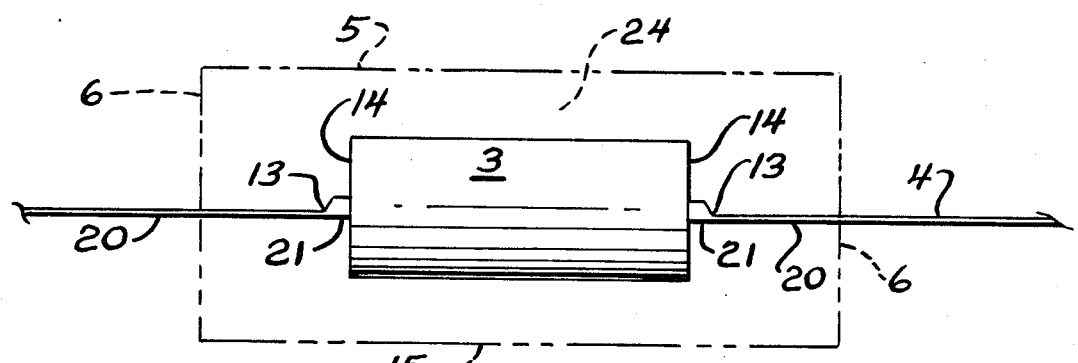
FIG. 3 is an elevational view of a surface-mounted resistor.

Similarly, it should be apparent that other electrical devices with axial leads can be packaged as described above for power resistors. This, substitution of, for example, an inductor, or diode, or capacitor for the resistor of FIGS. 1-3 will give a surface-mount device whose role as an electrical component differs, but whose functional characteristics as a surface-mount component are identical to those of the surface-mount power resistors described within.

What is claimed is:

1. A surface-mount power electrical resistor comprising:
    a power resistor of conventional design having a first body with opposite ends;
    a pair of electrical leads exiting from the opposite ends of the first body and extending axially outwardly therefrom;
    each of said leads having a circular cross section along its length from its point of exit from the body to a transition point, and having a ribbon shape along its length thereafter, with the ribbon portion of each lead being approximately coplanar; and,
    a hardened molding compound of electrically insulating and thermally conducting material surrounding and completely embedding the resistor of conventional design from a point on the ribbon shaped portion of one lead to a corresponding point on the other lead to form a second body with opposite ends and having at least two opposing flat and coparallel surfaces other than the ends, a portion of the ribbon shaped lead exiting from each of the ends of the second body and protruding approximately coplanarly therefrom, said molding compound encasing and providing rigid structural support for the transition points of said leads.

2. The resistor of claim 1 where the second body is a generally rectangular block with a top surface, a bottom surface, two opposite side surfaces, and two opposing end surfaces.

3. The resistor of claim 2 where the lower surface has two outer recesses for receiving the leads.

4. The resistor of claim 3 where each of said recesses in generally inclined toward the upper surface.

5. The resistor of claim 3 where the leads exiting from the ends of the second body are shaped into a J-bend design with the terminal portion of the leads fit into the recesses.

6. The resistor of claim 3 where the lower surface has a central channel.

7. A surface-mount electrical device with axial leads comprising:
    a device with axial leads of conventional design a first body with opposite ends;

a pair of electrical leads exiting from the opposite ends of the first body and extending axially outwardly therefrom;

each of said leads having a circular cross section along its length from its point of exit from the body to a transition point, and having a ribbon shape along its length thereafter, with the ribbon portion of each lead being approximately coplanar; and, a hardened molding compound of electrically insulating and thermally conducting material surrounding and completely embedding the device with axial leads of conventional design from a point on the ribbon shaped portion of one lead to a corresponding point on the other lead to form a second body with opposite ends and having at least two opposing flat and coparallel surfaces other than the ends, a portion of the ribbon shaped lead exiting from each of the ends of the second body and protruding approximately coplanarly therefrom, said molding compound encasing and providing rigid structural support for the transition points of said leads.

8. A surface-mount electrical device of claim 7 where the device is an inductor, a diode, or a capacitor.

9. The device of claim 7 where the second body is a generally rectangular block with a top surface, a bottom surface, two opposite side surfaces, and two opposing end surfaces.

10. The device of claim 9 where the lower surface has two outer recesses for receiving the leads.

11. The device of claim 10 where each of said recesses in generally inclined toward the upper surface.

12. The resistor of claim 10 where the leads exiting from the ends of the second body are shaped into a J-bend design with the terminal portion of the leads fit into the recesses.

13. The device of claim 10 where the lower surface has a central channel.

* * * * *